United States Patent [19]

Reynolds et al.

[11] Patent Number: 4,783,640

[45] Date of Patent: Nov. 8, 1988

[54] SIMULTANEOUS-DELAY CORRELATOR APPARATUS

[75] Inventors: Samuel C. Reynolds, Hawthorne; Donald C. D. Chang, Thousand Oaks, both of Calif.

[73] Assignee: Hughes Aircraft Company, Los Angeles, Calif.

[21] Appl. No.: 138,541

[22] Filed: Dec. 28, 1987

[51] Int. Cl.[4] ........................... H01P 9/00; H01P 5/12; H03P 15/00
[52] U.S. Cl. .................................. 333/156; 333/157; 333/161; 333/166; 364/824
[58] Field of Search ............... 333/150, 153, 156, 161, 333/166, 18, 23, 28 R, 157, 160, 164; 364/819, 820, 821, 823, 824, 728

[56] References Cited

U.S. PATENT DOCUMENTS

| | | | |
|---|---|---|---|
| 3,833,867 | 9/1974 | Solie | 333/150 |
| 4,041,419 | 8/1977 | Desormie e et al. | 333/150 |
| 4,207,545 | 6/1980 | Grudkowski et al. | 333/166 |
| 4,291,286 | 9/1981 | Wagner | 333/202 X |

Primary Examiner—Marvin L. Nussbaum
Attorney, Agent, or Firm—M. J. Meltzer; A. W. Karambelas

[57] ABSTRACT

A correlator apparatus that simultaneously delays two time-varying input signals using just a single transmission line, with the signals being connected to opposite ends of the line. Directional couplers spaced along the transmission line extract delayed versions of the two input signals, for correlation by a bank of correlators, to produce a correlation envelope for the two signals. The apparatus is substantially less massive than prior apparatus of this kind and can be easily constructed and aligned.

6 Claims, 4 Drawing Sheets

SIMULTANEOUS-DELAY CORRELATOR APPARATUS

BACKGROUND OF THE INVENTION

This invention relates generally to apparatus for correlating two time-varying input signals, and, more particularly, to a simultaneous-delay correlator apparatus that delays the two input signals simultaneously and produces a correlation envelope representing the correlation of one input signal with multiple delayed and advanced versions of the other input signal.

Apparatus of this particular kind are useful in many applications. One such application is as a component of a spectrometer that measures the cross power spectrum of two time-varying input signals. In the case of microwave signals, the apparatus can be implemented in either waveguide form or strip line form.

One typical simultaneous-delay correlator apparatus of this kind is depicted in FIG. 1. It includes two parallel transmission lines 6 and 7, one for each input signal. Each transmission line includes a plurality of directional couplers 8 spaced along its length, to produce multiple delayed versions of each input signal. Prescribed pairs of these delayed signals are correlated with each other to produce a plurality of correlation signals, i.e., a correlation envelope, representing the cross correlation of the two input signals. In FIG. 1, each such individual correlation is shown being performed by a simple square-law detector 9, which provides a real correlation. Alternatively, a complex correlation can be provided using a combination of mixers and phase shifters. A fast-Fourier transform device (not shown) can then operate on the plurality of correlation signals, to produce a real or complex cross power spectrum of the two input signals. In the special case where the two input signals are the same, the plurality of correlation signals represent an autocorrelation of the signal and the fast-Fourier transform device produces that signal's power spectrum.

Although the simultaneous-delay correlator apparatus described briefly above has proven generally effective in correlating two time-varying input signals, it is believed to be unduly complex and massive for many applications. In addition, construction and alignment of the apparatus can sometimes be difficult, which leads to low product repeatability. It should therefore be appreciated that there is a need for a simplified simultaneous-delay correlator apparatus that is smaller in size and easier to construct and align than previous correlator apparatus. The present invention fulfills this need.

SUMMARY OF THE INVENTION

The present invention is embodied in a simultaneous-delay correlator apparatus that produces a correlation envelope for two time-varying input signals, with substantially reduced size and complexity. In accordance with the invention, the two input signals are delayed simultaneously using just a single transmission line, with the two input signals being connected to the transmission line's opposite ends. Taps are spaced along the length of the transmission line, to produce a plurality of delayed versions of the two input signals, and correlator devices then correlate prescribed pairs of the delayed signals, to produce a plurality of correlation signals, i.e., a correlation envelope. This correlation envelope represents the cross correlation of the two input signals.

The apparatus of the invention has particular utility as part of a microwave spectrometer system. In such a system, Fourier transform means operates on the correlation envelope to produce a cross power spectrum of the two input signals. A bank of integrators or low pass filters can be interposed between the individual correlator devices and the Fourier transform means, to reduce short-term variations in the power spectrum.

The correlator apparatus of the invention can be implemented in either waveguide form or strip line form. Circulators are located at the transmission line's opposite ends, for coupling the two input signals onto the line, and multiple directional-coupler taps are located along the transmission line's length. To maximize the resolution of the correlation envelope and the power spectrum, as many taps as possible are used. Whether the transmission line is a waveguide or a strip line, these taps can be spaced along opposite sides of the transmission line, in a staggered relationship.

When merely a real correlation between the two input signals is to be performed, each correlator device that correlates a prescribed pair of delayed versions of the two signals can take the form of a simple mixer. When a complex correlation is to be performed, on the other hand, each correlator device can include two mixers and a phase shifter, to produce in-phase and quadrature-phase correlation signals. Using in-phase and quadrature-phase hybrids without a 90-degree phase shifter is an alternative implementation.

Other aspects and advantages of the present invention will become apparent from the following description of the preferred embodiments, taken in conjunction with the accompanying drawings, which illustrate, by way of example, the principles of the invention.

DESCRIPTION OF THE PREFERRED EMBODIMENTS

Figure 1:
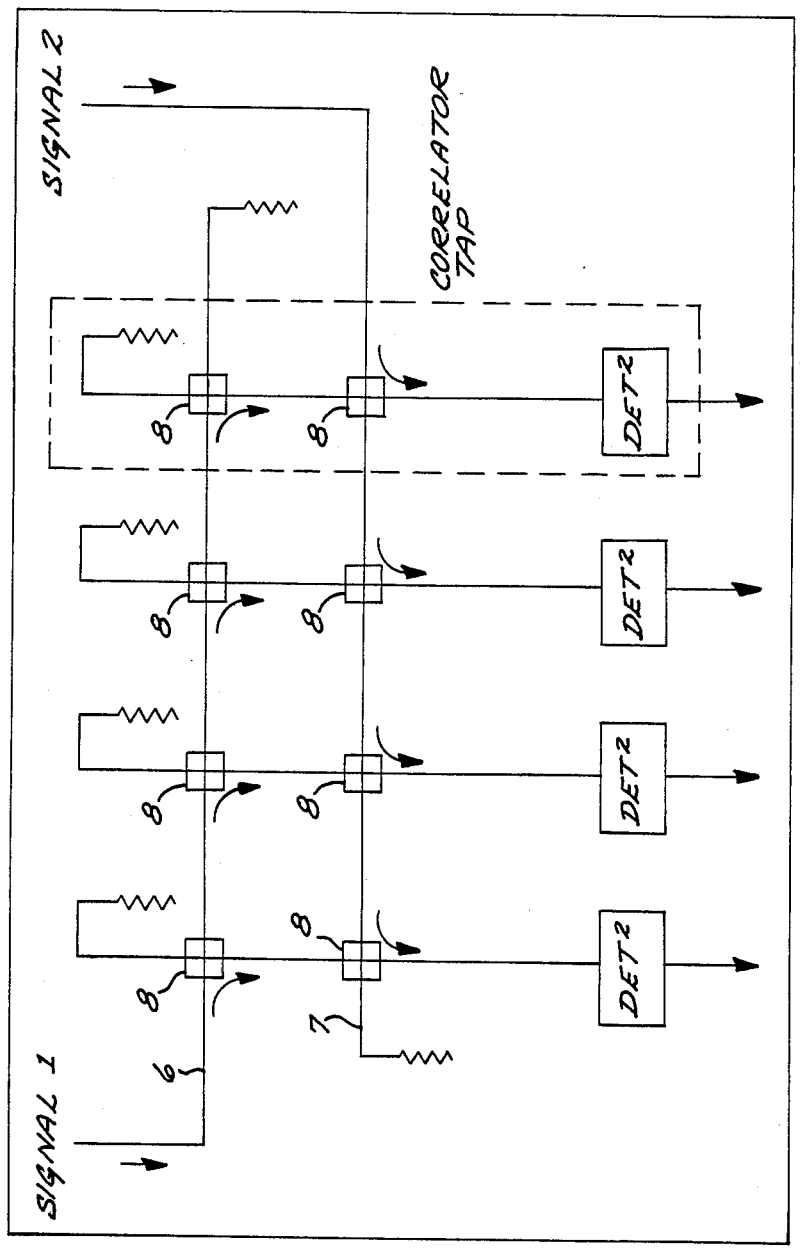
FIG. 1 is a schematic diagram of a prior art simultaneous-delay correlator apparatus, which includes two separate transmission lines, one for each of two input signals being correlated.
Figure 2:
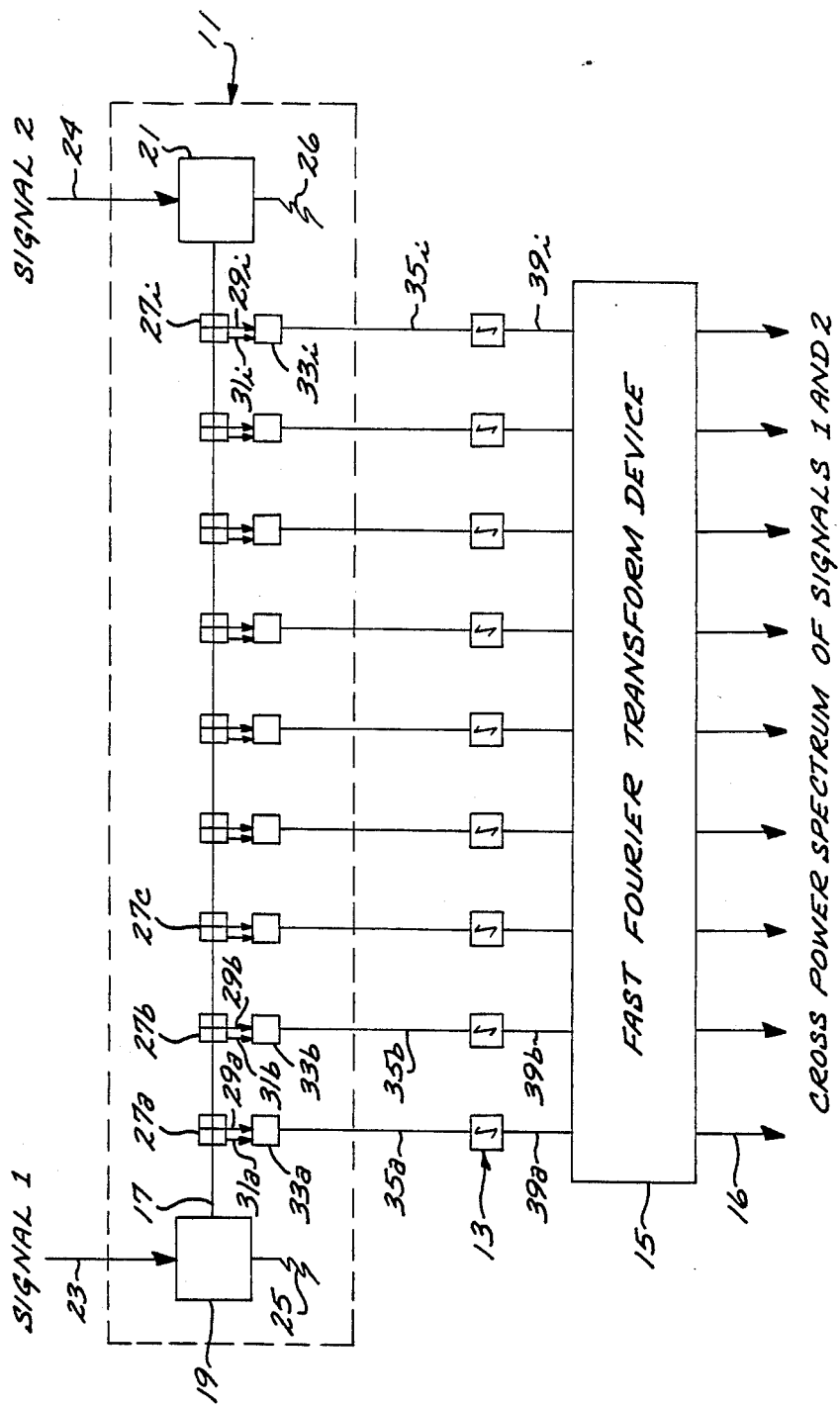
FIG. 2 is a schematic diagram of a spectrometer that includes a simultaneous-delay correlator apparatus embodying the invention, with just a single transmission line for simultaneously delaying two input signals being correlated.

With reference now to the drawings, and particularly to FIG. 2, there is shown a microwave spectrometer for correlating two time-varying input signals and determining the cross power spectrum of the two signals. The spectrometer includes a simultaneous-delay correlator apparatus 11 that delays the two input signals and correlates the delayed signals in a prescribed fashion to produce a plurality of correlation signals, representing a correlation envelope for the two input signals. A bank of integrators 13 limits the bandwidth of the plurality of correlation signals, and a fast-Fourier transform device 15 then operates on the band-limited correlation signals, to produce a cross power spectrum of the first and second input signals, for output on lines 16.

In accordance with the invention, a single transmission line 17 is used to delay the first and second input signals simultaneously. The use of just a single transmission line to accomplish this function greatly simplifies the correlator apparatus 11 and substantially reduces both its mass and cost of manufacture, while at the same time improving reliability.

Circulators 19 and 21 are located at the opposite ends of the single transmission line 17. One circulator 19 receives the first input signal, supplied on line 23, and couples that signal onto the line for transmission in a first direction, i.e., left-to-right in FIG. 2. Similarily, the other circulator 21 receives the second input signal, supplied on line 24, and couples that signal onto the line for transmission in the opposite direction, i.e., right-to-left in FIG. 2. Appropriate matched-load terminations 25 and 26 are associated with the respective circulators 19 and 21.

A plurality of directional couplers 27a-27i are spaced along the transmission line 17, for outputting delayed versions of the first and second input signals being transmitted in both directions along the line. Nine such directional couplers are depicted in FIG. 2, although it will be appreciated that the invention is not limited to any specific number.

Each directional coupler 27 provides outputs on two separate lines 29 and 31. One line 29 carries a predetermined proportion of the signal traveling left-to-right along the transmission line 17, while the other line 31 carries a corresponding proportion of the signal traveling right-to-left along the transmission line. In the particular case of the correlator apparatus of FIG. 2, if it is assumed that the plurality of directional couplers are equally spaced from each other and from the two circulators 19 and 21, and if the time delay along the transmission from one coupler to the next is a unit time t, then the first coupler 27a will output on line 29a a predetermined proportion of the first input signal delayed by 1t and on the line 31a a predetermined proportion of the second input signal delayed by 9t. Similarly, the second directional coupler 27b will output on line 29b a predetermined proportion of the first input signal delayed by 2t and on line 31b a predetermined proportion of the second input signal delayed by 8t, and so on. Thus, the nine directional couplers 27a-27i together will output pairs of signals differing from each other in time by 8t, 6t, 4t, 2t, 0, −2t, −4t, −6t and −8t.

The correlator apparatus 11 further includes a plurality of mixers 33a-33i, one for each of the respective directional couplers 27a-27i, for multiplying together the two signal pairs output by each coupler on lines 29 and 31. This produces nine separate correlation signals output by the mixers on lines 35a-35i and representing the correlation envelope for the first and second input signals. The nine correlation signals represent the correlation of the first input signal with the second signal, at time delay intervals of 8t, 6t, 4t, 2t, 0, −2t, −4t, −6t and −8t.

As the first and second input signals travel down the transmission line 17, they progressively diminish in amplitude. This is due to a predetermined proportion of each signal being tapped off by the successive directional couplers 27. Thus, the magnitude of the delayed first input signal output on line 29i by the coupler 27i will be substantially lower than the magnitude of the delayed first signal output on line 29a by the coupler 27a. Similarly, the magnitude of the delayed second input signal output on line 31a by the coupler 27a will be substantially lower than the magnitude of the delayed second signal output on line 31i by the coupler 27i. The products of the pairs of delayed signals output by the plurality of couplers 27a-27i, which are determined by the respective mixers 33a-33i, are therefore all substantially equal, for input signals of uniform magnitude.

The first and second input signals traveling in opposite directions along the transmission line 17 form an electromagnetic interference pattern. In general, for input signals having multiple and varying frequency components, this interference pattern is quite complicated. However, an understanding of the pattern can be enhanced if the two input signals are initially assumed to be pure sine waves having the same frequency. In such a circumstance, a standing wave is formed in the transmission line, with the wave's position depending on the relative phasing of the two signals. If the frequencies of the two sine waves change together, the lobe spacing of the standing wave changes, correspondingly. Increasing the frequency decreases the lobe spacing, whereas decreasing the frequency increases the lobe spacing.

If the two input signals are now assumed to be pure sine waves at different frequencies, a varying interference pattern is formed in the transmission line 17, which, over sufficient time, will average to zero. Thus, if the first and second input signals are complicated, with multiple frequency components, they can be broken down into their component frequencies and the resulting interference pattern between the corresponding components of the two input signals determined. The resulting interference pattern will be the sum of the numerous simple patterns.

As previously mentioned, the microwave spectrometer of FIG. 2 further includes a plurality of integrators 13a-13i for limiting the bandwidths of the correlation signals output by the plurality of mixers 33a-33i on lines 35a-35i, respectively. These integrators stabilize the level of each signal and eliminate transient effects due to short term correlations that ultimately average to zero. The fast-Fourier transform device 15 operates on the band-limited correlation signals output by the integrators 13a-13i on lines 39a-39i to determine the cross power spectrum of the first and second input signals. This fast-Fourier transform device can be implemented in either hardware or software.

Figure 3:
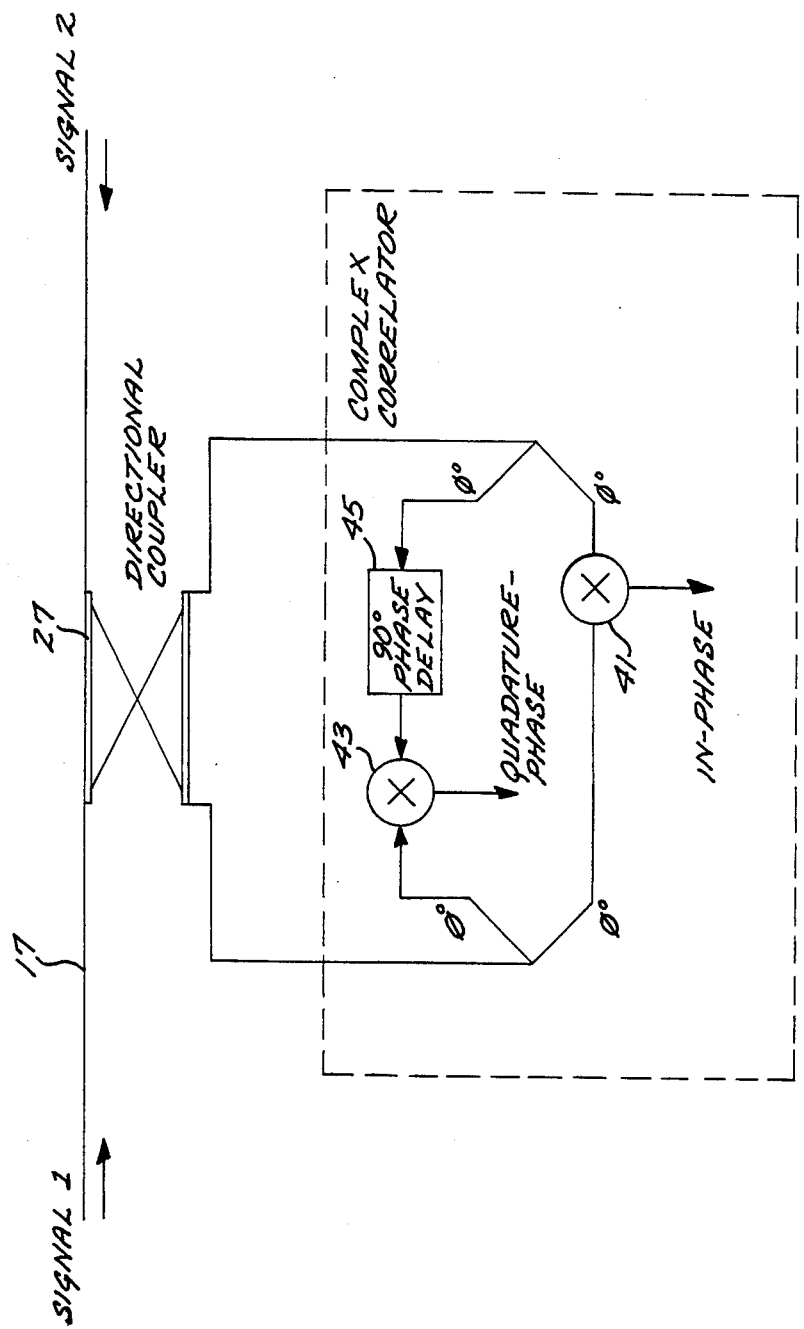
FIG. 3 is a schematic diagram of one directional coupler and complex correlator included in the simultaneous-delay correlator apparatus of FIG. 2, the complex correlator producing in-phase and quadrature-phase correlation signals for one pair of delayed input signals.

In a variation of the simultaneous-delay correlator apparatus 11 of FIG. 2, the plurality of mixers 33a-33i, which each produce merely a single correlation signal indicative of the real, or in-phase, correlation of the two signals supplied to it, can be substituted by a corresponding plurality of complex correlator devices that produce both real (i.e., in-phase) and imaginary (i.e., quadrature-phase) output correlation signals. One such complex correlator is depicted in FIG. 3. As is conventional, it includes two mixers 41 and 43 and a phase shifter 45 for shifting the phase of one of the two signals supplied to it by ninety degrees. A correlator apparatus that includes a plurality of such complex correlators provides substantially more information about the correlation between the two input signals supplied to the apparatus on lines 23 and 24.

Figure 4:
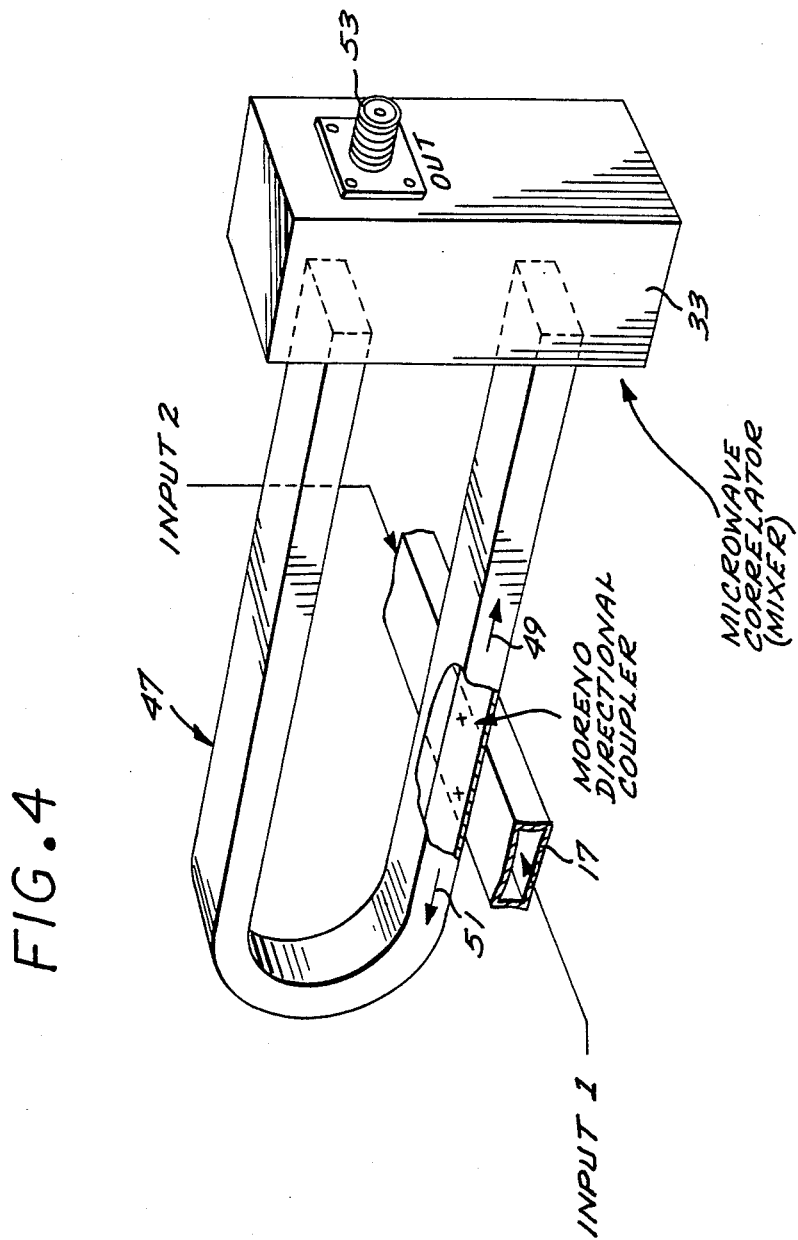
FIG. 4 is an isometric view of a waveguide implementation of one directional coupler and real correlator that can be used in the simultaneous-delay correlator apparatus of FIG. 2.

The simultaneous-delay correlator apparatus 11 of FIG. 2 can be conveniently implemented in either waveguide form or strip line form. FIG. 4 depicts a small portion of the transmission line 17, one directional coupler 27 and one mixer 33, using a waveguide implementation. The directional coupler is a conventional Moreno coupler, which includes a second waveguide oriented perpendicular to the transmission line waveguide 47, and which directs the second input signal being transmitted from right-to-left along the transmission line in a first direction 49 in the second waveguide, and which directs the first input signal being transmitted left-to-right in the transmission line in a second, opposite direction 51 in the second waveguide. The two ends of the second waveguide are connected directly to the mixer 33, for correlating. The mixer output is then provided at a terminal 53.

In the case of a strip line implementation, not shown specifically in the drawings, the directional couplers 27 can be conventional Lange couplers, and the transmission line 17 can be folded, to reduce space requirements. A strip line implementation would be much smaller than a corresponding waveguide implementation.

The simultaneous-delay correlator apparatus 11 of FIG. 2 provides a resolution in accordance with the closeness of the spacing of the successive directional couplers 27a–27i. This resolution is enhanced by using as many couplers as possible and spacing them as closely together as possible. Whether the apparatus in implemented in waveguide form or strip line form, optimum resolution can be achieved by arranging successive couplers on opposite sides of the transmission line, in a staggered relationship. With such an implementation, spacing of the taps as close as one-quarter wavelength can be achieved using waveguides.

It should be appreciated from the foregoing description that the present invention provides an improved simultaneous-delay correlator apparatus that is substantially less massive than prior apparatus of this kind and that can be easily constructed and aligned. The apparatus simultaneously delays two time-varying input signals using just a single transmission line, with the signals being connected to opposite ends of the line. Directional couplers spaced along the transmission line extract delayed versions of the two input signals for correlation by a bank of correlators or mixers, to produce a correlation envelope for the two signals.

Although the invention has been described in detail with reference to the presently-preferred embodiments, those of ordinary skill in the art will appreciate that various modifications can be made without departing from the invention. Accordingly, the invention is defined only by the following claims.

We claim:

1. Autocorrelation apparatus for operating on a time-varying input signal, comprising:

a transmission line having a first input terminal at one end, a second input terminal at an opposite end, and a plurality of taps at spaced locations along its length;

means for connecting a time-varying input signal to both the first input terminal and the second input terminal of the transmission line, such that the signal propagates simultaneously in opposite directions along the line, from the first terminal to the second terminal and from the second terminal to the first terminal;

wherein each of the plurality of taps along the transmission line outputs predetermined fractions of both the input signal propagating from the first input terminal and the input signal propagating from the second input terminal, each delayed by a separate predetermined amount; and correlation means for correlating the two delayed signals output by each of the plurality of taps, to produce a plurality of correlation signals representing an autocorrelation of the input signal.

2. Apparatus for correlating a first time-varying input signal with a second time-varying input signal, comprising:

a transmission line having a first input terminal at one end, a second input terminal at an opposite end, and a plurality of taps at spaced locations along its length;

means for connecting a first time-varying input signal to the first input terminal of the transmission line, such that the signal propagates in a first direction along the line;

means for connecting a second time-varying input signal to the second input terminal of the transmission line, such that the signal propagates in a second direction along the line;

wherein each of the plurality of taps along the transmission line outputs predetermined fractions of both the first input signal and the second input signal, each delayed by a separate predetermined amount; and correlation means for correlating both the in-phase and quadrature-phase components of the delayed first and second input signals output by each of the plurality of taps, to produce a plurality of correlation signals representing a complex cross correlation of the first input signal with the second input signal.

3. Apparatus for correlating a first time-varying input signal with a second time-varying input signal, comprising:

a transmission line having a first input terminal at one end, a second input terminal at an opposite end, and a plurality of taps at spaced locations along its length;

means for connecting a first time-varying input signal to the first input terminal of the transmission line, such that the signal propagates in a first direction along the line;

means for connecting a second time-varying input signal to the second input terminal to the transmission line, such that the signal propagates in a second direction along the line;

wherein each of the plurality of taps along the transmission line outputs predetermined fractions of both the first input signal and the second input signal, each delayed by a separate predetermined amount;

correlation means for correlating the delayed first signal with the delayed second signal output by each of the plurality of taps, to produce a plurality of correlation signals representing a cross correlation of the first input signal with the second input signal; and Fourier transform means for operating on the plurality of correlation signals to produce a corresponding plurality of signals representing the cross-power spectrum of the first and second input signals.

4. Apparatus as defined in claim 3, and further including means for time-averaging the plurality of correlation signals prior to processing by the Fourier transform means.

5. Apparatus for correlating a first time-varying input signal with a second time-varying input signal, comprising:
- a waveguide having a first input terminal at one end, a second input terminal at an opposite end, and a plurality of taps at spaced locations along its opposite sides, in a staggered relationship with each other;
- means for connecting a first time-varying input signal to the first input terminal of the waveguide, such that the signal propagates in a first direction along the waveguide;
- means for connecting a second time-varying input signal to the second input terminal to the waveguide, such that the signal propagates in a second direction along the waveguide;
- wherein each of the plurality of taps along the waveguide outputs predetermined fractions of both the first input signal and the second input signal, each delayed by a separate predetermined amount; and
- correlation means for correlating the delayed first signal with the delayed second signal output by each of the plurality of taps, to produce a plurality of correlation signals representing a cross correlation of the first input signal with the second input signal.

6. Apparatus for correlating a first time-varying input signal with a second time-varying input signal, comprising:
- a strip line having a first input terminal at one end, a second input terminal at an opposite end, and a plurality of taps at spaced locations along its opposite sides, in a staggered relationship with each other;
- means for connecting a first time-varying input signal to the first input terminal of the strip line, such that the signal propagates in a first direction along the line;
- means for connecting a second time-varying input signal to the second input terminal of the strip line, such that the signal propagates in a second direction along the line;
- wherein each of the plurality of taps along the strip line outputs predetermined fractions of both the first input signal and the second input signal, each delayed by a separate predetermined amount; and
- correlation means for correlating both the delayed first signal with the delayed second signal output by each of the plurality of taps, to produce a plurality of correlation signals representing a cross correlation of the first input signal with the second input signal.

* * * * *